United States Patent [19]

Feldmann et al.

[11] Patent Number: 6,041,170

[45] Date of Patent: Mar. 21, 2000

[54] APPARATUS AND METHOD FOR ANALYZING PASSIVE CIRCUITS USING REDUCED-ORDER MODELING OF LARGE LINEAR SUBCIRCUITS

[75] Inventors: Peter Feldmann, Short Hills; Roland W. Freund, New Providence, both of N.J.

[73] Assignee: Lucent Technologies, Inc., Murray Hill, N.J.

[21] Appl. No.: 08/904,233

[22] Filed: Jul. 31, 1997

[51] Int. Cl.$^7$ .................................................. G06F 17/50
[52] U.S. Cl. ................................ 395/500.23; 395/500.34
[58] Field of Search ........................ 395/500.23, 500.03, 395/500.34

[56] References Cited

U.S. PATENT DOCUMENTS

| | | | |
|---|---|---|---|
| 5,163,015 | 11/1992 | Yokota ..................................... | 364/578 |
| 5,313,398 | 5/1994 | Rohrer et al. ........................... | 364/468 |
| 5,379,231 | 1/1995 | Pillage et al. ........................... | 364/488 |
| 5,469,366 | 11/1995 | Yang et al. .............................. | 364/489 |
| 5,537,329 | 7/1996 | Feldman et al. ........................ | 364/489 |
| 5,689,685 | 11/1997 | Feldmann et al. ...................... | 395/500 |

OTHER PUBLICATIONS

"A Lanczos–Type Method for Multiple Starting Vectors", J.I. Aliaga, D.L. Boley, R.W. Freund and V. Hernandez, Numerical Analysis No. 96–18, Bell Laboratories, Sep. 1996.

"Network Analysis and Synthesis", Brian D.O. Anderson and Sumeth Vongpanitlerd, Prentice–Hall 1973.

"Padé Approximants Second Edition", George A. Baker, Jr. and Peter Graves–Morris, Cambridge University Press, pp. 1–9, 442–466, 1996.

"Padé Approximation of Linear Circuit Response via Passive Circuit Synthesis", J. Eric Bracken, Manuscript. No date, no pg #s.

"Efficient Linear Circuit Analysis by Padé Approximation via the Lanczos Process", P. Feldmann and R.W. Freund, Proc. Euro–DAC, Sep. 1994. No pg #s.

"Efficient Linear Circuit Analysis by Padé Approximation via the Lanczos Process", P. Feldmann and R.W. Freund, IEEE Trans. Computer–Aided Design vol. 14, No. 5, pp. 639–649, May 1995.

"Reduced–Order Modeling of Large Linear Subcircuits via a Block Lanczos Algorithm", P. Feldmann and R.W. Freund, in Proc. 32nd ACM/IEEE Design Automation Conf., Jun. 1995. No pg #s.

"Computation of Matrix Padé Approximations of Transfer Functions via a Lanczos–type Process", R. W. Freund, Approximation Theory VIII, vol. 1, pp. 215–222, 1995.

"Reduced–order Modeling of Large Passive Linear Circuits by Means of SyPVL Algorithm", R.W. Freund and P. Feldmann, Tech. Digest, IEEE/ACM International Conference on Computer–Aided Design, Nov. 1996. No pg #s.

"Software for Simplified Lanczos and QMR Algorithms", R.W. Freund and N.M. Nachtigal, Appl. Numer. Math., vol. 19, pp. 319–341, 1995.

"Matrix Computations" Third Edition, G.H. Golub and C.F. Van Loan, The John Hopkins University Press, pp. 134–174, 1996.

(List continued on next page.)

*Primary Examiner*—Kevin J. Teska
*Assistant Examiner*—Leigh Marie Garbowski
*Attorney, Agent, or Firm*—Synnestvedt & Lechner LLP

[57] ABSTRACT

A method and apparatus for generating and analyzing a reduced-order model of a linear circuit. The method and apparatus generates the symmetric multi-port transfer function of an RLC circuit. The invention employs a novel symmetric block-Lanczos-type procedure, termed SyMPVL for Symmetric Matrix Padé via Lanczos, to reduce original circuit matrices to a pair of banded symmetric matrices. When the circuit comprises only two of the three RLC components, the matrices are also positive definite. These matrices are typically much smaller than the original circuit matrices and determine a reduced-order model of the original multi-port transfer function of the circuit. The reduced transfer function represents a matrix-Padé approximation of the original multi-port matrix transfer function.

34 Claims, 6 Drawing Sheets

OTHER PUBLICATIONS

"Matrix Interpretations and Applications of the Continued Fraction Algorithm", W.B. Gragg, Rocky Mountain J. Math, vol. 4, pp. 213–225, 1974.

"Stable and Efficient Reduction of Large, Multiport RC Networks by Pole Analysis Via Congruence Transformations", K.J. Kerns and A.T. Yang, Manuscript. No date, no pg #s.

"An Iteration Method for the Solution of the Eigenvalue Problem of Linear Differential and Integral Operators", C. Lanczos, J. Res. Nat. Bur. Standards, vol. 45, pp. 255–282, 1950.

"Asympotic Waveform Evaluation for Timing Analysis", L.T. Pillage and R.A. Rohrer, IEEE Trans. Computer–Aided Design, vol. 9, pp. 352–366, Apr. 1990.

"AWE–Inspired", V. Raghavan, R.A. Rohrer, L.T. Pillage, J.Y. Lee, J.E. Bracken, and M.M. Alaybeyi, Proc. IEEE Custom Integrated Circuits Conference, May 1993. No pg #s.

"Equivalent Circuit Models for Three–Dimensional Multiconductor Systems", A.E. Ruehli, IEEE Trans. Microwave Theory and Tech., vol. 22, pp. 216–221, Mar. 1974.

"Implementation Aspects of Band Lanczos Algorithms for Computations of Eigenvalues of Large Sparse Symmetric Matrices", A. Ruhe, Moth. Comp., vol. 33, pp. 680–687, 1979.

"A Coordinate–Transformed Arnoldi Algorithm for Generating Guaranteed Stable Reduced–Order Models of RLC Circuits", L. M. Silveira, M. Kamon, I. Elfadel and J. White, Tech. Dig. 1996 IEEE/ACM International Conference on Computer–Aided Design, Nov. 1996. No. pg #s.

"Computer Methods for Circuit Analysis and Design", Second Edition, J. Vlach and K. Singhal, Van Nostrand Reinhold, pp. 110–143, 1993.

"Lumped and Distributed Passive Networks", M.R. Wohlers, Academic Press, pp. 30–84, 1969.

APPARATUS AND METHOD FOR ANALYZING PASSIVE CIRCUITS USING REDUCED-ORDER MODELING OF LARGE LINEAR SUBCIRCUITS

FIELD OF THE INVENTION

The invention pertains to a method and apparatus for analyzing electrical circuits. More particularly, the invention pertains to a method and apparatus for analyzing linear subcircuits of a larger circuit by means of a Lanczos type procedure to reduce original linear circuit matrices to a pair of banded smaller matrices.

BACKGROUND OF THE INVENTION

Electrical circuits typically are comprised of linear circuit elements, such as resistors, inductors, and capacitors as well as non-linear circuit elements, such as transistors and power sources. In the process of designing circuits, particularly large scale integrated circuits, it is normal practice to mathematically model the circuit. Particularly, the outputs of the circuit are modeled as a function of the inputs to the circuit. The mathematical model is used to determine various response characteristics of the circuit.

In our prior patent applications, application Ser. No. 08/269,230, filed Jun. 30, 1994, now U.S. Pat. No. 5,537,329 and application Ser. No. 08/489,270, filed Jun. 9, 1995, now U.S. Pat. No. 5,689,685, both of which are incorporated herein by reference, we disclosed new methods and apparatus for modeling linear subcircuits within a larger electrical circuit.

An electrical circuit, such as an integrated circuit, frequently contains large portions thereof comprised entirely of linear circuit elements. For instance, a wire or other connector usually can be modeled as a network of resistances and capacitances. Accordingly, the entire interconnect structure between a last non-linear circuit element in an integrated circuit and the end of a package pin can be mathematically modeled as a linear subcircuit.

The modeling of the larger overall circuit can be extremely complex in large scale integrated (LSI) circuits and very large scale integrated (VLSI) circuits. Our aforementioned patent application Ser. No. 08/489,270 discloses a technique for modeling the linear subcircuit portions within the larger circuit by a greatly reduced matrix compared to the original matrix equation for the linear subcircuit.

More specifically, each connection point of a linear subcircuit to elements outside of the bounds of the linear subcircuit is modeled as both an input and an output in a matrix formula for the linear subcircuit. Accordingly, a linear subcircuit having p electrical connection points to circuitry outside of the bounds of the linear subcircuit is modeled using a p by p matrix function.

Referring to our aforementioned patent applications, in U.S. patent application Ser. No. 08/269,230, we disclosed a Padé via Lanczos method for determining a scalar Padé approximant of a transfer function of a linear circuit for use in determining, with substantial accuracy, the frequency response behavior of the linear circuit.

In U.S. patent application Ser. No. 08/489,270, we disclosed an extension to the previous application in which the Padé via Lanczos method was extended to matrix transfer functions. More specifically, U.S. patent application Ser. No. 08/489,270 discloses a numerically stable method to determine a matrix Padé approximation of the frequency response of a linear circuit or subcircuit with little numerical degradation, and providing an acceptable computational cost per order of approximation. The method reduces the very large matrices used to represent the p by p matrix transfer function to a pair of much smaller matrices so that the resulting approximate matrix transfer function has basically the same characteristics as the original matrix transfer function. Using the method and apparatus disclosed therein, the original matrix can be reduced to any particular size desired. The accuracy of the approximation depends on the order of reduction in size of the matrices. Generally, the matrices can be reduced to a very large extent without significant decrease in accuracy.

One potential application for the reduction methods disclosed in the aforementioned patent applications is use on one or more linear subcircuits in a larger circuit. In such an application, the reduced equations can be inserted into the equation for the larger overall circuit, thus greatly reducing the complexity of the mathematical model for the overall non-linear circuit. While such application of these techniques can greatly simplify analysis of the larger non-linear circuit, the reductions still may remain very complex and be very time consuming in themselves. Accordingly, it is desireable to further reduce the complexity of the procedure for generating reduced-order circuit models to whatever extent possible in order to minimize the required processing power and/or time. Also, there is an ever-present drive to increase the accuracy of the models.

Therefore, it is an object of the present invention to provide an improved method and apparatus for generating a reduced order matrix approximant of the transfer function associated with a passive circuit.

SUMMARY OF THE INVENTION

The present invention is a method and apparatus for analyzing linear circuits using reduced-order mathematical matrix approximations thereof generated by a matrix Padé via Lanczos type procedure. In particular, it is a specialized adaptation of the previously known matrix Padé via Lanczos method. The present invention is particularly adapted for use with passive, linear circuits. In particular, the restriction to passive, linear circuits guarantees that the circuit matrices will be symmetric. When the additional condition is met that the circuit (or subcircuit) contains only two types of linear circuit elements, (i.e., resistor and inductor, resistor and capacitor, or inductor and capacitor), the matrices are guaranteed to be not only symmetric, but also positive definite, which guarantees stability and passivity of the approximation.

The present invention is a method and apparatus for the computation of the symmetric multi-port transfer function of an RLC circuit. It employs a novel symmetric block-Lanczos procedure to reduce original circuit matrices to a pair of banded symmetric reduced-order matrices, herein termed SyMPVL (for Symmetric Matrix Padé via Lanczos type procedure). When the circuit comprises only two of the three RLC components, the matrices are also positive definite, guaranteeing stability and passivity. The reduced transfer function represents a matrix-Padé approximation of the original multi-port matrix transfer function.

DETAILED DESCRIPTION OF THE INVENTION

Figure 1:
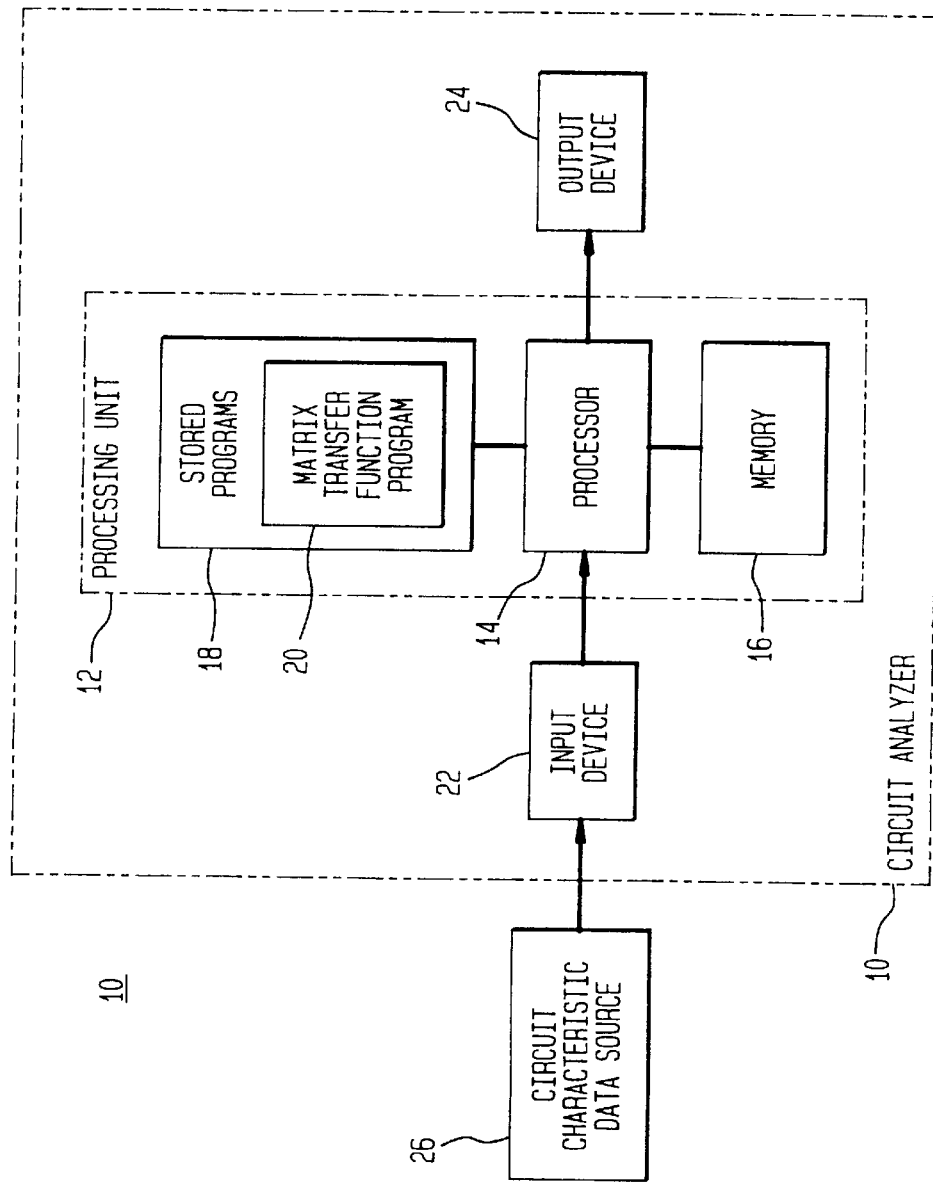
FIG. 1 is a block diagram of the components of an exemplary apparatus in accordance with the present invention.

Referring to the drawings, in which like reference numerals identify similar or identical elements, as shown in FIG. 1, the present disclosure describes an apparatus and method implementing a circuit analyzer 10, which includes a processing unit 12 having a processor 14, memory 16, and stored programs 18, including a matrix transfer function program 20; an input device 22; and an output device 24.

The present invention is an improvement over the method and apparatus disclosed in aforementioned application Ser. No. 08/489,270, which can cut the processing load by approximately one-half while still generating a highly accurate model. The new method and apparatus disclosed herein is particularly adapted for use in connection with purely passive circuits or subcircuits, i.e., circuits which can be modeled with symmetric matrices. Further, the method and apparatus guarantees stability and passivity of the model if the circuit is an RL, RC, or LC circuit.

In an exemplary embodiment, the processing unit 12 is a SPARC workstation available from SUN MICROSYSTEMS, INC. having about 32 MB associated RAM memory and a hard or fixed drive memory 15. The processor 14 operates using the UNIX operating system to run application software 18 implementing the disclosed circuit analyzer 10 and method.

It should be understood that the above described processor is merely exemplary and that any computer or processing system having sufficient processing ability and memory may be employed.

A description of the circuit to be analyzed is provided from a circuit characteristic data source 26 through an input device 22 to the processor 14. The data source 26 may be any source for providing the circuit characteristic information to the computer, such as a floppy disk containing a circuit characteristic file or a keyboard on which is typed the circuit characteristic data. The input device 22 may be a keyboard, a floppy disk drive or other data reading device.

The processor 14 receives commands and the circuit characteristic data from the circuit characteristic data source 26 through the input device 22. The received circuit characteristic data may be stored in memory 16 for further processing to generate a frequency response signal representing the approximated or predicted frequency response of the circuit. The generated frequency response signal of a linear subcircuit may be a sub-goal in the overall analysis of a larger, non-linear circuit.

The generated frequency response signal may be used by the processor 14 to generate a graphic representation for plotting the approximated frequency response in volts, amps, or other units as a function of frequency. The graphic representation is sent to an output device 24 such as a display for displaying the predicted frequency response of the circuit under analysis. Alternately, the output device 24 may include specialized graphics programs to convert the generated frequency response signal to a displayed graphic. In additional embodiments, the generated frequency response signal may include determined poles, zeros, and/or residues listed in a file for output as columns or tables of text by the output device 24 which may be a display or a hard copy printer.

The circuit analyzer 10 performs the application programs and subroutines described hereinbelow in conjunction with FIGS. 2–3, which are implemented from compiled source code in the C++ and/or FORTRAN programming languages.

Figure 2:
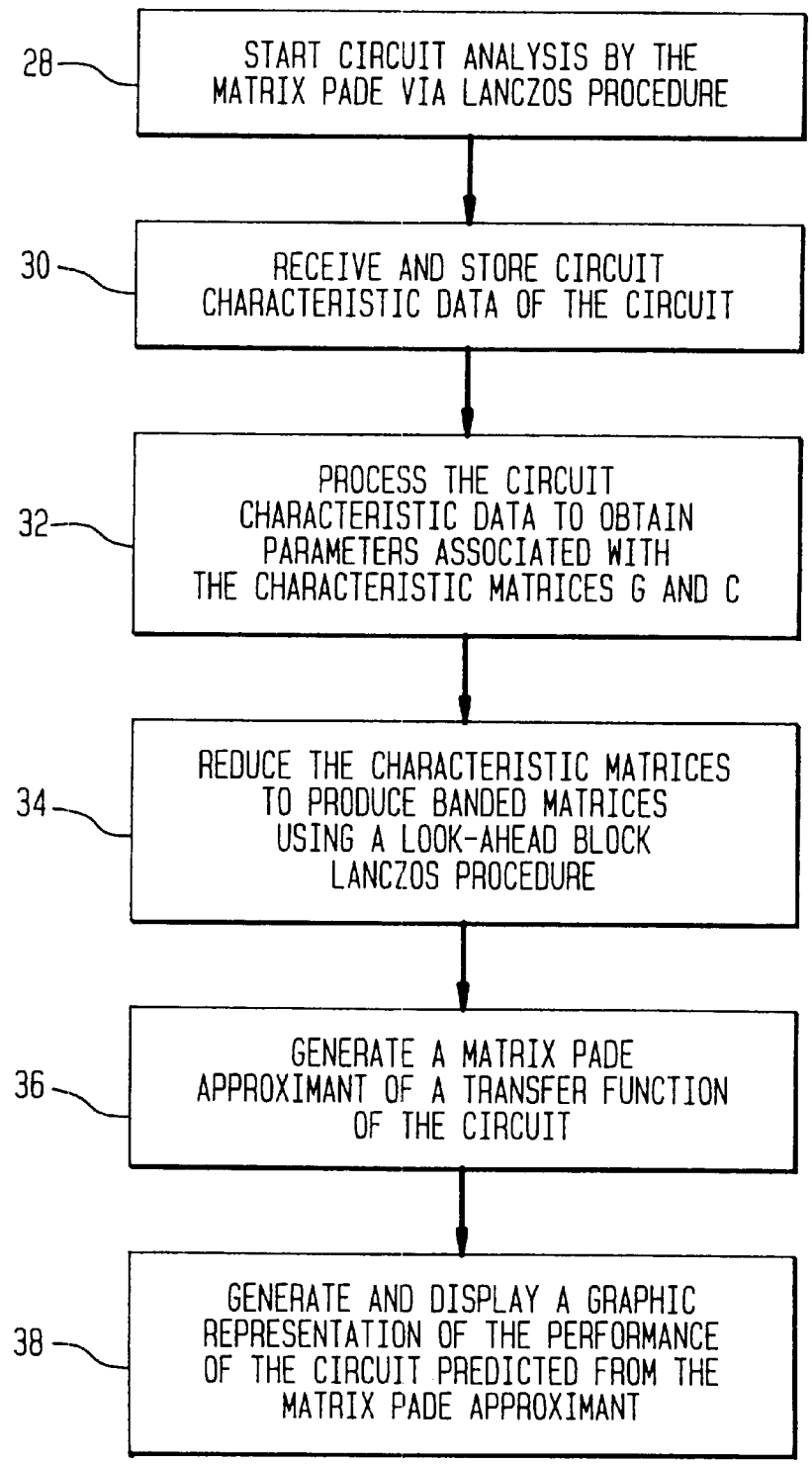
FIG. 2 is a flow chart illustrating an exemplary set of steps in accordance with the present invention employing a symmetric matrix Padé approximant of the frequency response of a passive, linear circuit.

Referring to FIG. 2, the circuit analyzer 10 includes software for generating a frequency response signal of a circuit. In step 28, the program for generating the frequency response of the circuits is started. In step 30, the circuit characteristic data is received and stored in memory 16 for use with the program. In step 32, the program generates two circuit characteristic matrices G and C that mathematically describe the circuit. These matrices are square matrices of the same size, the size typically being of the order of the number of circuit elements in the circuit or subcircuit.

In step 34, the matrices are reduced in size, remaining symmetric, by use of a look-ahead block Lanczos procedure. The results of this reduction are the matrices $T_n$ and $\Delta_n$. The look-ahead block Lanczos procedure carried out in step 34 also produces the matrix, $\rho$, which contains input/output information.

Figure 5:
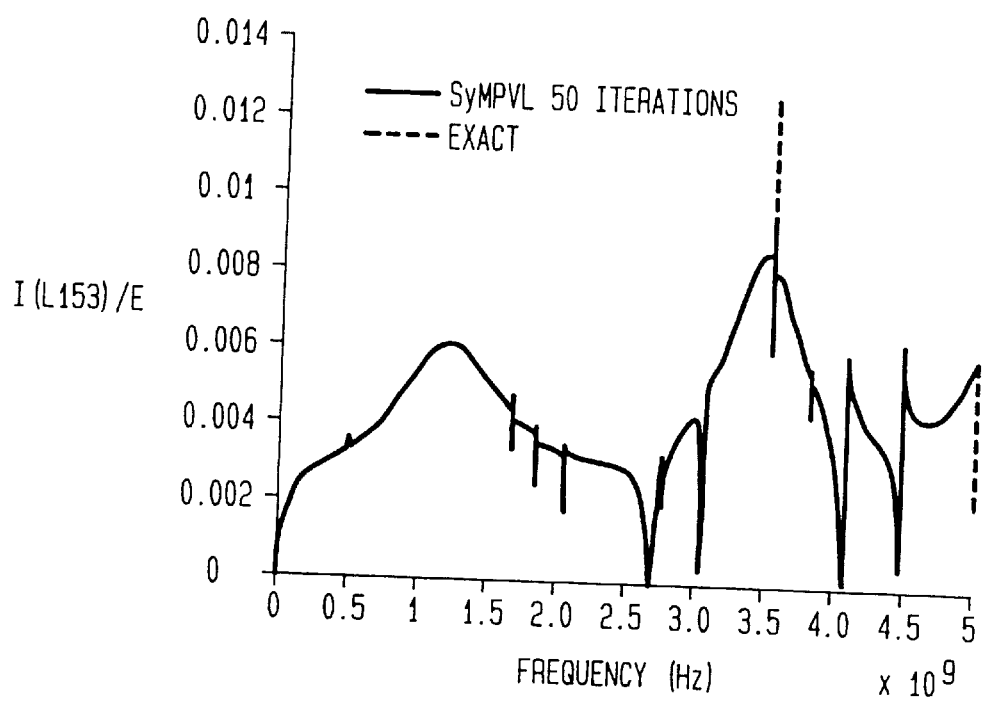
FIG. 5 is a diagram of the magnitude of the transfer function of the circuit illustrated in FIG. 4.
Figure 7:
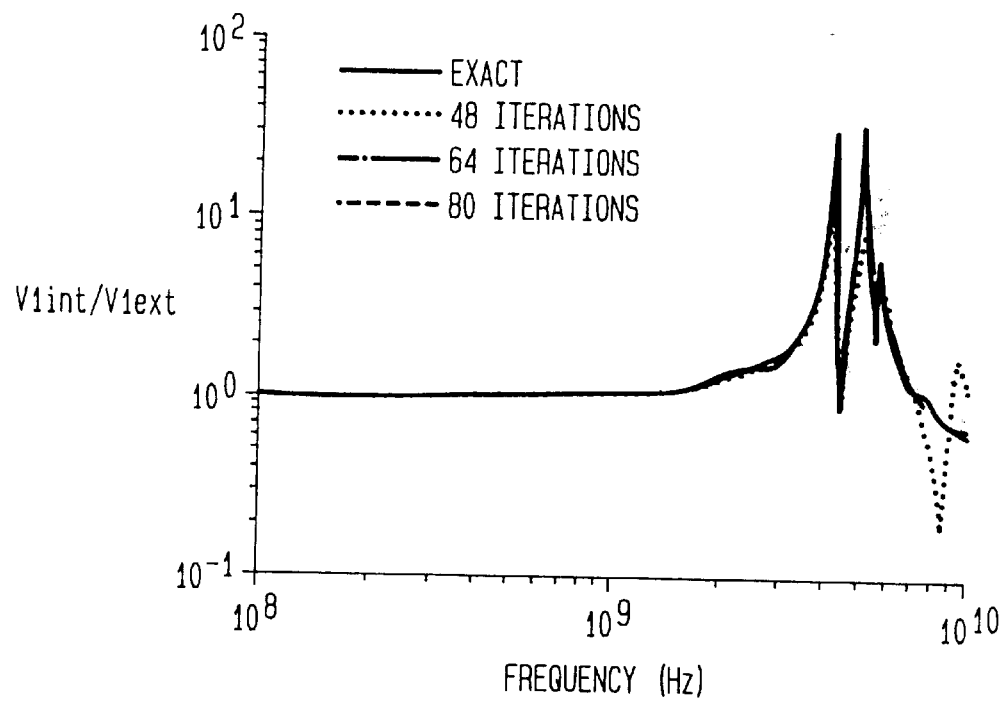
FIG. 7 is a diagram of the magnitude of the transfer function with respect to a first pin of the exemplary integrated circuit package of FIG. 6.
Figure 8:
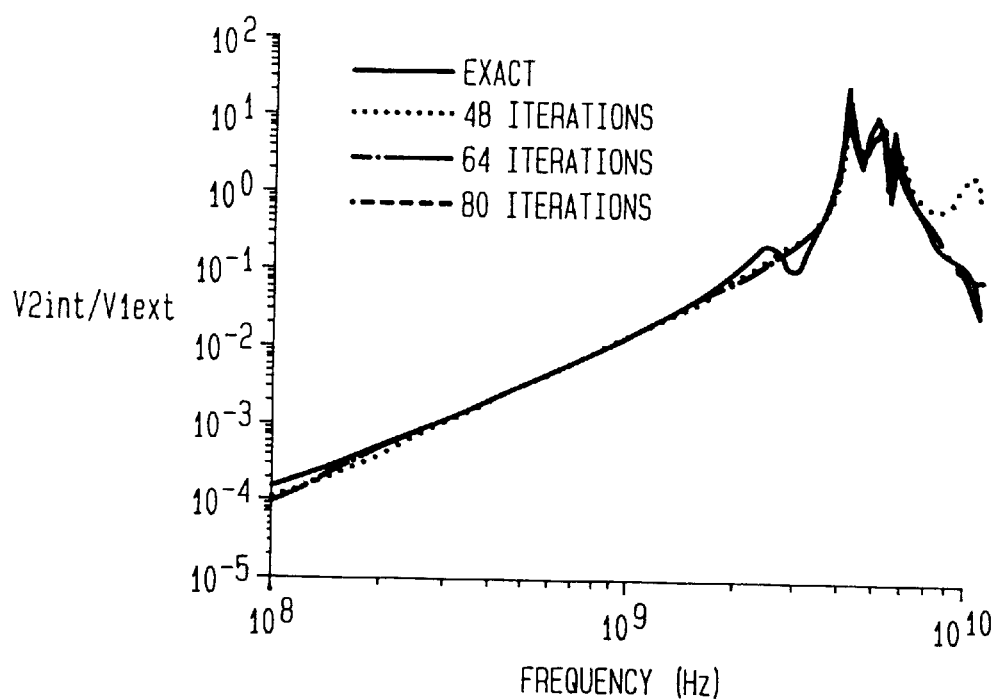
FIG. 8 is a diagram of the magnitude of the transfer function with respect to a second pin of an exemplary integrated circuit package.

In step 36, the matrices of $\rho$, $T_n$ and $\Delta_n$ are used to generate a matrix Padé approximant, $Z_n(s)$, of a transfer function of the circuit, where s is complex frequency. In step 38, the matrix Padé approximant is applied to generate a graphic representation of the circuit response predicted by the approximant. The representation typically may be a graph of the signal (e.g., voltage or current magnitude) at a particular terminal of the circuit plotted against frequency, such as illustrated in FIGS. 5, 7 and 8.

Figure 3:
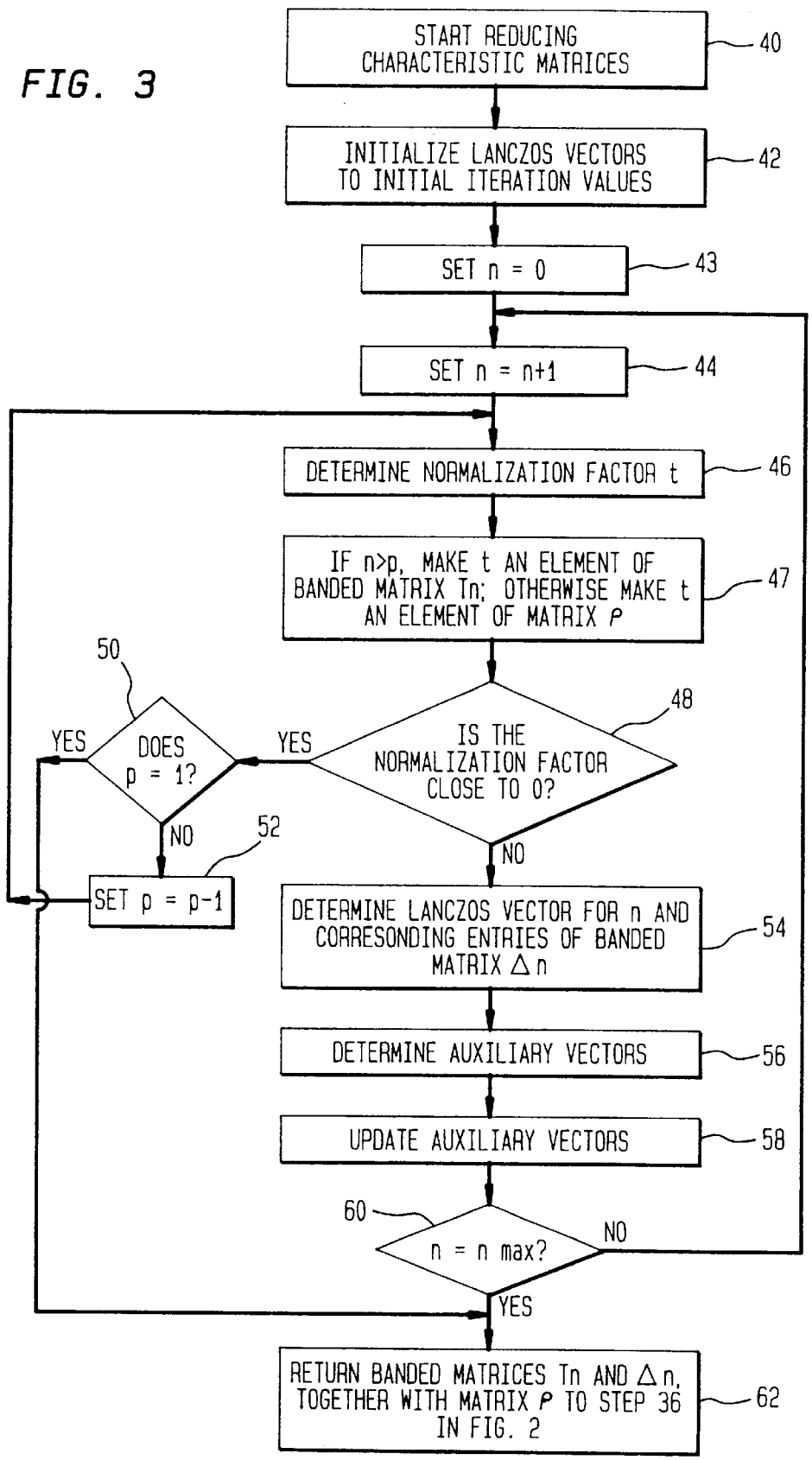
FIG. 3 is a flow chart illustrating the details of step 34 of FIG. 2.

FIG. 3 shows the details of step 34 for reducing the characteristic matrices G and C. The subroutine is started in step 40. In step 42, the Lanczos vectors are initialized to initial iteration values. In step 43, a value of zero is assigned to variable n. Since the steps to follow will be iterated for values of n from 1 to $n_{max}$, n is incremented by one in step 44. In step 46, a normalization factor $t_{n,\,n-p}$ is determined as an element of the banded matrix $T_n$.

In step 48, it is determined if the normalization factor is substantially near zero. If so, it is then determined, in step 49, whether p is equal to 1, where p started out as the number of connection points to outside circuitry in the circuit under analysis, but which is being decremented every time the normalization factor is determined to be substantially near zero, as explained more fully below. If p has reached one, the iterations are stopped in step 50. Otherwise, p is decremented by 1 in step 52 and control flows back to step 46 for further iterations through steps 46 to 52 until p is equal to 1. If the normalization factor is not substantially near zero, control flows to steps 54 through 60.

In step 54, the Lanczos vector for the present value of n as well as corresponding entries in the matrix $\rho_n$ are determined. In step 56, the values of auxiliary vectors are determined, and, in step 58, the value of the auxiliary vectors are updated. In step 60, it is determined if the last iteration, i.e., for n=$n_{max}$, has been performed. If not, the process returns to loop through steps 44 through 60 until either n has reached $n_{max}$ or p has reached one. When the iterations are completed by virtue of either n having reached $n_{max}$ or p having reached one, flow proceeds to step 62 where the banded matrix $T_n$ is formed from the iterated values of the variables and vectors and is returned to step 36 in FIG. 2 along with the matrices $\rho_n$ and $\rho_{n'}$.

Returning to FIG. 2, in step 36, the generated banded matrices $T_n$ and $\Delta_n$, together with the matrix $\rho$ generated in step 34 are used to determine a matrix Padé approximant of the frequency response of the circuit in a manner comparable to the method described in aforementioned U.S. application Ser. No. 08/489,270. For example, eigenvalues and eigenvectors of $T_n$ may be generated to determine the poles and residues of the frequency response of the circuit, and $T_n$ may be used to calculate the zeros of the frequency response of the circuit.

As mentioned above, U.S. application Ser. No. 08/489, 270, U.S. Pat. No. 5,689,685, discloses a method and apparatus termed MPVL (Matrix Padé via Lanczos-type process), for the accurate and efficient computation of reduced-order models of large linear circuits. MPVL generates a reduced-order model, the transfer function of which represents the matrix-Padé approximation of the original circuit's matrix transfer function. MPVL is a general procedure, in the sense that it can stably compute reduced-order models for any linear system and for different number of inputs and outputs up to the desired level of accuracy. In contrast, RLC circuits can be characterized in terms of square and symmetric matrix transfer functions. Moreover, all the matrices resulting from formulating the RLC circuit equations are symmetric. Direct application of the MPVL procedure to RLC circuits does not take advantage of this special structure and cannot guarantee in general the preservation of stability and passivity of the approximation.

The preservation of the stability and passivity properties of the circuits being modeled is a significant requirement for reduced-order models. RLC circuits, being composed entirely of passive components, are always stable and passive. This property should not be violated by the reduced-order model.

The invention is a method and apparatus that computes symmetric matrix-Padé approximations of the circuit matrix transfer function. It employs a novel symmetric block-Lanczos procedure to reduce original circuit matrices to a pair of banded symmetric reduced-order matrices, herein termed SyMPVL (for Symmetric Matrix Padé via Lanczos type procedure).

I. Symmetric Formulation of Circuit Equations

This section formulates the equations that describe general RLC circuits, and discusses the special cases of RC, RL, and LC circuits. The matrices associated with the circuit equations are always symmetric and, in the special cases, are also positive semi-definite. These properties are important for SyMPVL and for stability and passivity proofs.

A. General RLC Circuits

This subsection discloses the details of step 32 of FIG. 2. The connectivity of a circuit can be captured using a directional graph. The nodes of the graph correspond to the nodes of the circuit, and the edges of the graph correspond to each of the circuit elements. An arbitrary direction is assigned to graph edges, so one can distinguish between the source and destination nodes. The adjacency matrix, A, of the directional graph describes the connectivity of a circuit. Each row of the matrix corresponds to a graph edge and, therefore, to a circuit element. Each column of the matrix corresponds to a graph or circuit node. The column corresponding to the datum (ground) node of the circuit is omitted in order to remove redundancy. By convention, a row of the connectivity matrix will contain +1 in the column corresponding to the source node, −1 in the column corresponding to the destination node, and 0 everywhere else. It is easy to see that Kirchhoff's laws, which depend only on connectivity can be expressed using the adjacency matrix $$KCL: A^T i_b = 0$$

$$KCL: Av_n = v_b \qquad \text{(Eqs. 1)}$$

where $i_b$ and $v_b$ are the vectors of branch currents and voltages, respectively, and $v_n$ is the vector of the non-datum node voltages.

We are interested in analyzing RLC circuits and, for simplicity, we assume that the circuit is excited only by current sources. In this case, the adjacency matrix and the branch current and voltage vectors can be partitioned according to circuit-element types as follows:

$$A = \begin{bmatrix} A_i \\ A_g \\ A_c \\ A_l \end{bmatrix}, \; v_b = \begin{bmatrix} v_i \\ v_g \\ v_c \\ v_l \end{bmatrix}, \; i_b = \begin{bmatrix} i_i \\ i_g \\ i_c \\ i_l \end{bmatrix}. \qquad \text{(Eq. 2)}$$

Here, the subscripts i, g, c, and l stand for branches containing current sources, resistors, capacitors, and inductors, respectively.

The set of circuit equations is completed by adding the so-called branch constitutive relationships (BCR's), which describe the physical behavior of the circuit elements. In the case of RLC circuits, the BCR's are as follows:

$$i_i = -I_t(t), \; i_g = \zeta v_g, \; i_c = \mathcal{C} \frac{d}{dt} v_c, \; v_l = \mathcal{L} \frac{d}{dt} i_l. \qquad \text{(Eq. 3)}$$

Here, $I_t(t)$ is the vector of current-source values, $\zeta$ and $\mathcal{C}$ are appropriately-sized diagonal matrices whose diagonal entries are the conductance and capacitance values of each element. It is clear that these values are positive for any physical circuit. The matrix L also is diagonal in the absence of inductive coupling. Inductive coupling introduces off-diagonal terms in the inductance matrix, but L remains symmetric and positive definite.

The modified nodal formulation (MNA) of the circuit equations is obtained by combining the Kirchhoff equations (Eqs. 1) with the BCRs (Eq. 3), and eliminating as many current unknowns as possible. For the case of RLC circuits, only inductor currents need to be left as unknowns. The resulting MNA equations are as follows:

$$A_g^T \zeta A_G v_n + A_c^T \mathcal{C} A_c \frac{d}{dt} v_n + A_l^T i_l = A_i^T I_t(t), \qquad \text{(Eq. 4)}$$

$$A_l v_n - \mathcal{L} \frac{d}{dt} i_l = 0.$$

Writing (Eq. 4) in matrix form, we obtain $$\underbrace{\begin{bmatrix} A_g^T \zeta A_g & A_l^T \\ A_l & 0 \end{bmatrix}}_{G} \underbrace{\begin{bmatrix} v_n \\ i_l \end{bmatrix}}_{x} + \underbrace{\begin{bmatrix} A_c^T \mathcal{C} A_c & 0 \\ 0 & -\mathcal{L} \end{bmatrix}}_{C} \underbrace{\frac{d}{dt}\begin{bmatrix} v_n \\ i_l \end{bmatrix}}_{\frac{d}{dt}x} = \underbrace{\begin{bmatrix} A_i^T \\ 0 \end{bmatrix}}_{B} I_t(t). \quad \text{(Eq. 5)}$$

Note that the matrices G and C are symmetric. They are however indefinite in general.

We are interested in determining the network functions of the RLC block viewed as a p-terminal component. Since we allowed only the current sources in our formulation, it is natural to determine the Z-parameters. By applying the Laplace transform and assuming zero initial conditions, we obtain $$(G+sC)X=BI_s(s), \quad V_i=B^TX. \quad \text{(Eq. 6)}$$

Here, X, $I_s(s)$, and $V_i$ represent the Laplace transforms of the unknown vector x, the excitation current $I_t(t)$, and the vector of voltages across the excitation sources, respectively. Eliminating X in (Eq. 6) gives $$V_i = [A_i\ 0]X = \underbrace{B^T(G+sC)^{-1}B}_{z(s)}I_s(s) \quad \text{(Eq. 7)}$$

While for general RLC circuits the matrices G and C are indefinite, in some important special cases the formulation can be modified such that the matrices become positive semi-definite. In these special cases, important passivity and stability results can be proved.

B. Special Cases of RC, RL and LC Circuits

In the case of RC circuits, the matrices L, $A_l$, and the vector $i_l$ are empty. The Laplace transform of the MNA equations (Eq. 4) thus reduces to $$\underbrace{A_g^T \zeta A_g V_n}_{G} + \underbrace{A_c^t C A_c s V_n}_{C} = A_i^T I_s(s) \quad \text{(Eq. 8)}$$

Clearly, the matrices C and G are symmetric positive semi-definite.

In the case of RL circuits, the matrices $\mathcal{C}$ and $A_c$ are empty. The Laplace transform of the MNA equations (Eq. 4) now becomes $$A_g^T \zeta A_g V_n + A_l^T I_l = A_i^T I_s(s),\ A_l V_n - L s I_l = 0. \quad \text{(Eq. 9)}$$

By multiplying the first equation in (Eq. 9) by s and substituting $sI_l$ from the second, we obtain $$\underbrace{A_g^T \zeta A_g V_n s}_{C} + \underbrace{A_l^T \mathcal{L}^{-1} A_l V_n}_{G} = sA_i^T I_s(s), \quad \text{(Eq. 10)}$$

where the matrices C and G are again symmetric positive semi-definite.

In the case of LC circuits, the matrices $\zeta$ and $A_g$ are empty. The Laplace transform of the MNA equations (Eq. 4) reduced to $$A_c^T \mathcal{C} A_c s V_n + A_l^T I_l = A_i^T I_s(s),\ A_l V_n - L s I_l = 0. \quad \text{(Eq. 11)}$$

By multiplying the first equation in (Eq. 11) by s and substituting $sI_L$ from the second, we obtain $$\underbrace{A_c^T \mathcal{C} A_c V_n s^2}_{C} + \underbrace{A_l^T \mathcal{L}^{-1} A_l}_{G} = sA_i^T I_s(s). \quad \text{(Eq. 12)}$$

Again, the matrices C and G are symmetric positive semi-definite and a change of variables $\sigma = s^2$ brings (Eq. 12) to the usual form.

II. Padé Approximation of Matrix Transfer Functions

Recall from (Eq. 7) that the transfer function of a p-port is of the form $$Z(s)=B^T(G+sC)^{-1}B,\ s \in \mathbb{C}, \quad \text{(Eq. 13)}$$

where G and C are real symmetric N×N matrices, and B is a real N×p matrix. Note that Z is a matrix-valued rational function:

$$Z: \mathbb{C} \to (\mathbb{C} \cup \{\infty\})^{p \times p}. \quad \text{(Eq. 14)}$$

Moreover, each pole s of Z is also an eigenvalue of the matrix pencil G+λC, i.e., each pole s of Z satisfies the equation det (G+sC)=0.

A. Review of the Case p=1

For the moment, assume that p=1. In this case, Z is a scalar-valued rational function, and for each n, we can define a scalar-valued Padé approximant $Z_n$ to Z as follows. A function of the form $$Z_n(s) = \frac{\phi_{n-1}(s)}{\psi_n(s)}, \quad \text{(Eq. 15)}$$

where $\phi_{n-1}$ and $\psi_n$ are polynomials of degree at most n−1 and n, respectively, is called an nth Padé approximant to Z if $$Z(s)=Z_n(s)+O(s^{q(n)}), \quad \text{(Eq. 16)}$$

where q(n) is as large as possible. The condition (Eq. 16) means that the Taylor expansions of Z and $Z_n$ about s=0 agree in as many leading Taylor coefficients (the so-called moments) as possible. In general, q(n)=2n.

The standard approach to computing $Z_n$ is based on explicit moment generation. First, one computes the leading q(n) Taylor coefficients of Z, and from these, one then generates the coefficients of the polynomials $\phi_{n-1}$ and $\psi_n$ in (Eq. 15). This standard approach to computing $Z_n$ is employed in the asymptotic waveform evaluation (AWE) technique described in L. T. Pillage and R. A. Rohrer, "Asymptotic Waveform Evaluation for Timing Analysis," *IEEE Trans. Computer-Aided Design*, vol. 9, pp. 352–366, April 1990; V. Raghavan, R. A. Rohrer, L. T. Pillage, J. Y. Lee, J. E. Bracken and M. M. Alaybeyi, "AWE-inspired," in *Proc. IEEE Custom Integrated Circuits Conference*, May 1993. However, computing Padé approximants using explicit moment computations is inherently numerically unstable, and indeed, in practice, this approach can be used for very moderate values of n, such as n≤10. These numerical instabilities can be avoided by exploiting the Lanczos-Padé connection and generating the Padé approximant $Z_n$ via the Lanczos procedure. The resulting procedures for stably computing Padé approximants of transfer functions are PVL for general circuits and its special variant SyPVL for RLC circuits. In SyPVL, the Padé approximant $Z_n$ is computed using the formula $$Z_n(s)=\rho_n^T(A_n+sB_n)^{-1}\rho_n, \quad \text{(Eq. 17)}$$

where the n×n matrices $A_n$, $B_n$ and the vector $\rho_n$ are generated from a symmetric version of the Lanczos process.

B. The General Case p≧1

Returning to the general case of p-ports with p≧1, one approach to obtaining approximations of Z is to compute scalar Padé approximants for each of the $p^2$ entries of Z by means of $p^2$ runs of PVL. However, a much more efficient approach is to use the concept of matrix-Padé approximation [Eq. 3] that generates a matrix-valued approximation $Z_n$ for all entries of Z in one run. Moreover, the reduced-order model generated by $Z_n$ is much smaller than the reduced order model obtained from $p^2$ individual PVL runs.

Matrix-Padé approximants can be represented by means of a pair of numerator and denominator matrix polynomials whose coefficients can be obtained via explicit moment computations. However, this approach suffers from the same instability mentioned above for the case p=1. Instead, we use an appropriate extension of the formula (Eq. 17) to the general matrix case p≧1 in our definition of matrix-Padé approximants. More precisely, we say that a matrix-valued function $$Z_n: \mathbb{C} \to (\mathbb{C} \cup \{\infty\})^{p \times p}. \tag{Eq. 18}$$

is an nth matrix-Padé approximant to Z if $Z_n$ is of the form $$Z_n(s) = \rho_n^T (A_n + sB_n)^{-1} \rho_n, \tag{Eq. 19}$$

where $\rho_n \in \mathbb{C}^{n \times p}$ and $A_n, B_n \in \mathbb{C}^{n \times n}$ and $$Z(s) = Z_n(s) + \theta(s^{q(n)}) \tag{Eq. 20}$$

with maximal q(n).

In general, we have $q(n) \geq 2\lfloor n/p \rfloor$ if, and only if, so-called deflation occurs due to certain linear dependencies.

III. A Symmetric Lanczos-Type Procedure

In this section, the symmetric Lanczos-type procedure is formulated that generates appropriate matrices $A_n$, $B_n$, and $\rho_n$ such that the function $Z_n$ defined in (Eq. 19) is indeed an nth matrix-Padé approximant to Z. This section corresponds to steps 40–60 of FIG. 3, which, in turn, are the details of step 34 of FIG. 2.

In order to compute matrix-Padé approximants to matrix-valued transfer functions (Eq. 13), we need a Lanczos-type procedure that can handle multiple starting vectors, namely the p columns of the Matrix B in (Eq. 13). We used a special symmetric variant of the procedure described in R. W. Freund, "An Extension of the Lanczos-Padé Connection to the Matrix Case," Numerical Analysis Manuscript, Bell Laboratories, Murray Hill, N.J., in preparation, that exploits the symmetry of the matrices G and C in (Eq. 13). Lanczos-type procedures for multiple starting vectors are necessarily quite involved for two reasons. First, in the course of the procedure, some of the generated vectors can become linearly dependent and thus need to be deflated. Second, so-called look-ahead techniques are required to avoid potential breakdowns due to division by quantities that cannot be excluded to be zero. SyMPVL is the only existing Lanczos-type process that has both deflation and look-ahead built in.

Next, we give a precise statement of the symmetric Lanczos-type procedure used to compute matrix-Padé approximants to Z. This procedure could be directly stated in terms of G, C, and B, but then we would have to either store additional vectors or abandon the modified Gram-Schmidt orthogonalization used within the procedure. Instead, we assume that G is factored as $$G = MJM^T, \tag{Eq. 21}$$

where M, $J \in \mathbb{R}^{N \times N}$, and J is a "simple" matrix, such as, e.g., a diagonal matrix. For example, if M is real symmetric positive definite, then we can choose J=I (the N×N identity matrix). A factorization (Eq. 21) can be computed via a suitable version of the Bunch-Parlett-Kaufman procedure if G is indefinite, or a version of the Cholesky procedure if G is symmetric positive definite. We now state the Lanczos-type procedure in terms of M, $M^T$, J, C, and B. This corresponds to rewriting the transfer function (Eq. 13) as $$Z(s) = (M^{-1}B)^T (J + sM^{-1}CM^{-T})^{-1} (M^{-1}B), \tag{Eq. 22}$$

and applying the Lanczos procedure to the matrix $$F = M^{-1}CM^{-T} \tag{Eq. 23}$$

with starting vectors $M^{-1}B$, and constructing the Lanczos vectors $v_1, v_2, \ldots$, to be J-orthogonal. More precisely, if no look-ahead steps are necessary, the Lanczos vectors satisfy $$v_i^T J v_n = \begin{cases} \delta_n & \text{if } i = n, \\ 0 & \text{if } i \neq n, \end{cases} \text{ for all } i, n = 1, 2, \tag{Eq. 24}$$

If look-ahead steps do occur, then the Lanczos vectors are only cluster-wise J-orthogonal, instead of the vector-wise J-orthogonality (Eq. 24).

We note that after n steps of the Lanczos-type procedure below, the Lanczos vectors $$v_1, v_2, \ldots, v_n \tag{Eq. 25}$$

have been constructed. In addition, at the end of each nth step, there are $p_c = p_c(n)$ "auxiliary" vectors, $$\hat{v}_{n+1}, \hat{v}_{n+2}, \ldots, \hat{v}_{p_c}, \tag{Eq. 26}$$

available. These vectors will be turned into Lanczos vectors or deflated in successive iterations. Here, $p_c$ denotes the current block size. Initially, $p_c = p$, and then within the procedure $p_c$ is reduced by one every time a deflation occurs.

Procedure 1 (Symmetric Lanczos-type method with deflation and look-ahead.)

INPUT:

Matrices $G = G^T = MJM^T$, $C = C^T \in \mathbb{R}^{N \times N}$;

A block $B = [b_1 \ b_2 \ldots b_p] \in \mathbb{R}^{N \times p}$ of p starting vectors (the vectors $b_i$).

OUTPUT:

An $p_I \times p$ matrix $\rho$;

($p_I = p - (\#$ of deflations during the first p iterations).)

The non-zero entries of the n×n matrices $T_n$ and $\Delta_n$.

(Here, n is the value of the iteration counter at termination.)

0) For i=1, 2, . . . , p, set $$\hat{v}_i = J^{-1} M^{-1} b_i.$$

Set $p_c = p$.

($p_c$ is the current block size.)

Set $\Pi_v = \emptyset$.

($\Pi_v$ records indices of vectors that must be preserved due to inexact deflation. If $k \in \Pi_v$, then the newly constructed v vectors need to be J-orthogonalized against all vectors $v_i$ with $i \in \mathfrak{C}_k$.)

Set $\gamma=1$, $\mathfrak{C}_\gamma=\Pi$, and $V^{(\gamma)}=\Pi$.

$\gamma$ is the number of the currently constructed look-ahead cluster, and $\mathfrak{C}$ is the set of indices of the already constructed Lanczos vectors in the $\gamma$th cluster $V^{(\gamma)}$.)

For n=1, 2, . . . , do (Build nth Lanczos vector $v_n$.):

1) (Perform deflation (if necessary) and obtain $v_n$.)

1a) (Decide if $\hat{v}_n$ should be deflated.)
   (i) Set $\mu=n-p_c$.
   (ii) If the current $\gamma$th cluster contains at least one vector, i.e., $\mathfrak{C} \neq \emptyset$, then orthogonalize $\hat{v}_n$ against the vectors $v_i$ in that cluster:
   For all $i \in \mathfrak{C}_\gamma$ in ascending order), set
   (iii) (Deflate if $\|\hat{v}_n\|$ is "small".)

$$\tau_{i,\mu} = \frac{v_i^H \hat{v}_n}{\|v_i\|^2}, \hat{v}_n = \hat{v}_n - v_i \tau_{i,\mu}, \text{ and } t_{i,\mu} = t_{i,\mu} + \tau_{i,\mu}.$$

If $\|\hat{v}_n\| > \text{dtol}$, then continue with step 1b).
   Otherwise, deflate $\hat{v}_n$ by doing the following:
   (iv) If $p_c=1$, then stop.
   (There are no more Krylov vectors.)
   (v) If $\mu>0$ and the deflated vector $\hat{v}_n$ is non-zero, then set $\|_v = \|_v \cup \{\gamma(\mu)\}$, and save the vectors $v_i$, $i \in \mathfrak{C}_\gamma(\mu)$.
   (vi) Set $p_c = p_c - 1$.
   (The current block size is reduced by one.)
   (vii) For i=n, n+1, . . . , n+$p_c$-1, set $\hat{v}_i = \hat{v}_{i+1}$.
   (The auxiliary vector $\hat{v}_n$ is deflated. The indices of the remaining auxiliary vectors are reduced by one.)
   (viii) Repeat step 1a)

1b) (Normalize $\hat{v}_n$ to obtain the nth Lanczos vector $v_n$.)
Set $$v_n = \frac{\hat{v}_n}{t_{n,n-p_c}},$$

where $t_{n,n-p_c}$ is a suitable scaling factor, e.g., $$t_{n,n-p_c} = \|\hat{v}_n\|_2.$$

If $n \leq p_c$, then set $\rho_{n,n-p_c+m} = t_{n,n-p_c}$.

1c) (Update cluster information.)
   If $\mathfrak{C}_\gamma = \emptyset$, set $\gamma_v = \gamma(\max\{1, n-p_c\})$.
   Set $V^{(\gamma)} = [V^{(\gamma)} \ v_n]$, $\mathfrak{C}_\gamma = \mathfrak{C}_\gamma \cup \{n\}$, and $\gamma(n) = \gamma$.
   ($\gamma(n)$ is the index of the cluster containing the nth Lanczos vector $v_n$.)

2) (Compute $\Delta^{(\gamma)}$ and check for end of look-ahead cluster.)

2a) Form $$\Delta^{(\gamma)} = (V^{(\gamma)})^T J V^{(\gamma)}.$$

2b) (Decide if the current cluster is complete.) If the matrix $\Delta^{(\gamma)}$ is singular (or in some sense "close" to singular), then continue with step 3). Otherwise, the current cluster is complete and the following "end-of-cluster" updates are performed:

2c) (J-orthogonalize the vectors $\hat{v}_i$, $n+1 \leq i \leq n+p_c-1$, against the vectors $v_j$ in the current cluster.)
For i=n+1, n+2, . . . , n+$p_c$-1, set $$[t_{j,i-p_c}]_{j \in pullout;zu521800.900_\gamma} = (\Delta^{(\gamma)})^{-1} (V^{(\gamma)})^T J \hat{v}_i,$$

$$\hat{v}_i = \hat{v}_i - V^{(\gamma)} [t_{j,i-p_c}]_{j \in pullout;zu521800.900_\gamma},$$

and if $i \leq p_c$, set $[\rho_{j,i-p_c+m}]_{j \in \mathfrak{C}_\gamma} = [t_{j,i-p_c}]_{j \in \mathfrak{C}_\gamma}$.

2d) Increment the cluster counter $\gamma = \gamma+1$;
Set $\gamma(n+1) = \gamma$, $\mathfrak{C} = \emptyset$, and $V^{(\gamma)} = \emptyset$.
(The current cluster is complete, and so the vector $V_{n+1}$ constructed in the next iteration will start a new cluster.)

3) (Advance the block Krylov subspace and obtain new vector $\hat{v}_{n+p_c}$.)

3a) Obtain $$V = J^{-1} M^{-1} C M^{-T} v_n$$

by first solving the linear system $$M^T t = v_n$$

for t, then solving the linear system $$Mv = Ct$$

for v, and finally setting $v = J^{-1} v$.

If the current $\gamma$th cluster contains at least one vector, i.e., $C_\gamma \neq \emptyset$, we may add arbitrary combinations of the vectors in the $\gamma$th cluster to v:
Set $$v = v + V^{(\gamma)} [t_{i,\mu}]_{i \in pullout;zu521800.901_\gamma},$$

with arbitrary $t_{i,\mu} \in \mathbb{R}$.

3b) (J-orthogonalize v against previous Lanczos vectors.)
   (i) (J-orthogonalize v against clusters $V^{(k)}$, $\gamma_v \leq \gamma-2$.)
Set $$\delta = \Delta^{(\gamma-1)} \begin{bmatrix} 0 \\ \vdots \\ 0 \\ 1 \end{bmatrix}.$$

($\delta$ is the last column of $\Delta^{(\gamma-1)}$.)
For all $k = \gamma_v, \gamma_v+1, \ldots, \gamma-2$, set $$[t_{j,n}]_{j \in pullout;zu521800.901_k} = (\Delta^{(k)})^{-1} ([t_{i,j}]_{i \in pullout;zu521800.900_{\gamma-1}, j \in pullout;zu521800.900_k})^T \delta,$$
$$v = v - V^{(k)} [t_{j,n}]_{j \in pullout;zu521800.900_k}.$$

(ii) (Perform J-orthogonalization of v due to inexact deflation.)
For all $k \in \|_v$ with $k < \gamma_v$ (in ascending order), set $$[t_{j,n}]_{j \in pullout;zu521800.900_k} = (\Delta^{(k)})^{-1} (V^{(k)})^T J v, \ v = v - V^{(k)} [t_{j,n}]_{j \in pullout;zu521800.900_k}.$$

(iii) (J-orthogonalize v against cluster $V^{(\gamma-1)}$.)
Set $$[t_{j,n}]_{j \in pullout;zu521800.900_{\gamma-1}} = (\Delta^{(\gamma-1)})^{-1} (V^{(\gamma-1)})^T J v, \ \hat{v}_{n+p_c} = v - V^{(\gamma-1)} [t_{j,n}]_{j \in pullout;zu521800.900_{\gamma-1}}.$$

To get the nth matrix-Padé approximant $Z_n$ to Z, we need the following quantities from Procedure 1:

$$\rho_n = [\rho_{i,j}]_{1 \leq i \leq p_1, \ 1 \leq j \leq p},$$

$$T_n = [t_{i,j}]_{1 \leq i \leq n, \ 1 \leq j \leq n},$$

$$\Delta_n = \text{diag}(\Delta^{(1)}, \Delta^{(2)}, \ldots, \Delta^{(\gamma)}). \quad \text{(Eq. 27)}$$

The values, $\rho$, $T_n$ and $\Delta_n$ provided from step 34 (FIG. 2) are needed in step 36 for generating the matrix Padé approximant $Z_n(s)$.

Here, for $\rho$ and $T_n$ we use the convention that all the entries $\rho_{ij}$ and $t_{ij}$ that are not explicitly defined in Procedure 1 are set to zero. Then $$Z_n(s) = \rho_n^T(\Delta_n^{-1} + sT_n\Delta_n^{-1})^{-1}\rho_n, \rho_n = \begin{bmatrix} \rho \\ 0_{n-p_l \times p} \end{bmatrix}, \quad \text{(Eq. 28)}$$

is the nth matrix-Padé approximant to Z generated in step 36 (FIG. 2). For later use, we remark that the matrix $T_n$ can be viewed as a certain oblique projection of the matrix F defined in (Eq. 23) onto the space spanned by the first n Lanczos vectors. More precisely, assuming for simplicity that only zero vectors $\hat{v}_n = 0$ are deflated in Procedure 1, we have $$V_n^T J F V_n = \Delta_n T_n, \quad \text{(Eq. 29)}$$

where $$V_n = [V_1\ V_2\ \ldots\ V_n]. \quad \text{(Eq. 30)}$$

IV. Stability and Passivity

For RC, RL and LC circuits, the method and apparatus generates a stable and passive model, as discussed more fully below. For RLC circuits, Padé-based reduced-order models are in general not stable and not passive. However, if the order n is large enough so that the reduced-order models are sufficiently accurate, then the reduced-order models defined by $Z_n$ are almost stable and passive, and can in fact be made stable and passive by suitable post-processing of $Z_n$.

If the reduced-order model is used only for purposes of simulating the linear circuit or subcircuit itself (e.g., to validate the desired frequency response of a circuit design), then the model not being stable and/or passive is not a significant issue. However, if the reduced-order model is used in a larger simulated circuit or intended to be synthesized as an actual circuit, then it should be modified by suitable post-processing to insure stability and passivity.

The above-noted post-processing has not been fully been developed at this time and does not form a part of the present invention. However, by way of example, to achieve stability, a pole/residue representation of the matrix-Padé approximant $Z_n$, may be computed. This can be done by computing an eigen decomposition of the matrix $T_n$ in Equation 28. If the reduced-order model is unstable, then at least one of the poles in the pole/residue representation lies in the right half of the complex plane. A first approach to make the model stable is to simply drop the terms in the pole/residue representation of $Z_n$ that correspond to poles in the right half of the complex plane. Let us denote the resulting function by $Z_n$. If the original reduced-order model generated by SyMPVL was accurate enough, then it can be shown that the dropped terms are always small. Still, the modified function $Z_n$ is no longer a matrix-Padé approximant, since dropping the unstable terms will change the leading Taylor coefficients of $Z_n$ and thus the condition of matching leading Taylor coefficients of Z, which defines a matrix-Padé approximant, is no longer satisfied. A second approach is to make up for the dropped terms by modifying the retained stable poles and residues in the pole/residue representation of $Z_n$ in such a way that as many as possible leading Taylor co-efficients of $Z_n$ remain unchanged. The resulting stable reduced-order model is then at least a matrix-Padé-type approximant in the sense that it matches a number of leading Taylor co-efficients of Z, although this number is smaller than the number of co-efficients matched by a true matrix-Padé approximant. In principal, similar approaches can be employed to turn a non-passive reduced-order model into a passive one.

A. Stability of RL, RC and LC Circuits

Recall from the discussion in Section (I)(B) that the matrices G and C in the formula (Eq. 13) of the matrix transfer function Z are symmetric positive semi-definite for RC and RL circuits. Furthermore, for LC circuits, Z is given by (Eq. 13) with s replaced by $s^2$, where G and C are again symmetric positive semi-definite.

Since G is symmetric positive semi-definite, it follows that J=I in (Eq. 21). As a result, the Lanczos vectors generated by Procedure 1 are actually orthogonal, and thus $\Delta_n = I_n$ (the n×n identity matrix) for all n. Therefore, equation (28) reduces to $$Z_n(s) = \rho_n^T(I_n + sT_n)^{-1}\rho_n. \quad \text{(Eq. 31)}$$

Furthermore, the relation (Eq. 29) now becomes $$T_n = V_n^T F V_n. \quad \text{(Eq. 32)}$$

By (Eq. 23), the matrix F has the same eigenvalues as the symmetric positive semi-definite matrix C, and thus all eigenvalues of F are non-negative. Together with (Eq. 32), it follows that $T_n$ is symmetric positive semi-definite.

By (Eq. 31), all poles of $Z_n$ are of the form $$s = -\frac{1}{\lambda}, \text{ where } \lambda \text{ is an eigenvalue of } T_n. \quad \text{(Eq. 33)}$$

Since $T_n$ is symmetric positive semi-definite, $\lambda \geq 0$, and thus all poles of $Z_n$ are non-positive. Moreover, it can be shown that a possible pole s=0 is simple. Altogether, this proves that the reduced-order models defined by $Z_n$ are stable for RC and RL circuits. The case of LC circuits can be handled similarly, using the formula (Eq. 12) and the fact that the transformation of $s \to s^2$ maps the purely imaginary poles of an LC circuit into points on the negative real axis.

B. Passivity of RL, RC and LC Circuits

The reduced-order models defined by $Z_n$ also are passive. Again, we only treat the case of RC and RL circuits. The case of LC circuits can be handled similarly after the transformation $s \to s^2$ has been employed.

It is well known that the reduced-order model defined by the matrix-valued rational matrix $Z_n$ given by (Eq. 31) is passive if, and only if, the following three conditions are satisfied:

(i) $Z_n(s)$ has no poles in $\{s \in \mathbb{C} | \text{Re } s > 0\}$ (the right half of the complex plane);

(ii) $Z_n(\bar{s}) = \overline{T_n(s)}$ for all $s \in \mathbb{C}$;

(iii) For all $s \in \mathbb{C}$ with Re s>0, $$Re(x^H Z_n(s)x) \geq 0 \quad \text{(Eq. 34)}$$

for all $x \in \mathbb{C}^p$.

It thus remains to verify (i)–(iii). Condition (i) is satisfied in view of the stability of $T_n$. Condition (ii) follows immediately from (Eq. 31) and the fact that $T_n$ and $\rho_n$ are real matrices. Finally, with respect to condition (iii), let s be any complex number with Re s>0. Since $T_n$ is symmetric positive semi-definite, we have $$Re(y^H(I_n + sT_n)y) = \|y\|_2^2 + (Re\ s)y^H T_n y \geq 0 \quad \text{(Eq. 35)}$$

for all $y \in \mathbb{C}^n$.

For any given $x \in \mathbb{C}^p$, we set $$y=(I_n+sT_n)\rho_n x. \quad (Eq. 36)$$

Then $y \in \mathbb{C}^p$, and inserting (Eq. 36) into (Eq. 35) gives $$0 \leq Re(y^H(I_n+\bar{s}T_n)y) = Re(x^H\rho_n(I_n+sT_n)^{-1}\rho_n x) = Re(x^H Z_n(s)x). \quad (Eq. 37)$$

Hence the reduced-order model given by $Z_n$ is passive.

V. EXAMPLES

In this section, numerical results are applied to two example circuits.

A. The PEEC Circuit

Figure 4:
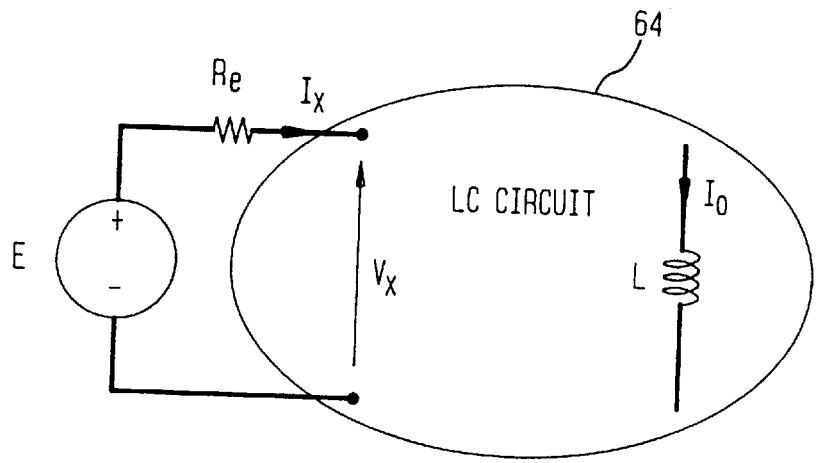
FIG. 4 is a partial circuit diagram of an exemplary circuit that can be analyzed using the method and apparatus of the present invention.

FIG. 4 shows an LC circuit 64 of interest. The details of the circuit 64 are not shown and are not necessary for this high level discussion other than the facts that the circuit consists of only inductors, capacitors, and inductive couplings and is driven by current $I_x$ from a finite impedance source comprising voltage source E and resistor $R_c$. We are interested in computing the response of this circuit; in this case, the current $I_o$ flowing through one of the inductors, L, in the circuit.

The equations of the LC two-port are obtained by writing the KCL equations and differentiating them with respect to time gives $$A_l^T sI_l + A_c^T sI_c + asI_x = 0. \quad (Eq. 38)$$

We substitute the inductor and capacitor equations $$sI_l = L^{-1}V_l = L^{-1}A_l V$$

and $$I_c = \mathbb{C} sV_c = \mathbb{C} A_c sV \quad (Eq. 39)$$

into the differentiated KCL equation (Eq. 38) and obtain the nodal circuit equations $$A_l^T L^{-1} A_l V + A_c^T \mathbb{C} A_c s^2 V + asI_x = 0. \quad (Eq. 40)$$

The output of interest is selected among the inductor currents, using the column vector b. This results in the relation $$sI_o = b^T sI_1 = \underbrace{b^T \mathcal{L}^{-1} A_l}_{l^T} V. \quad (Eq. 41)$$

Setting $$G = A_l^T L^{-1} A_l$$

and $$C = A_c^T \mathbb{C} A_c,$$

and simplifying s, the output of interest can be expressed as $$I_o = \underbrace{-l^T(G+s^2C)^{-1}a}_{\alpha} \cdot I_x = \frac{\alpha}{R_e + Z_e} E. \quad (Eq. 42)$$

The input impedance of the two-port is defined as the voltage $V_x$ when a unit valued current is applied:

$$V_x = a^T V = \underbrace{-a^T(G+s^2C)^{-1}as}_{Z_{in}} \cdot I_x. \quad (Eq. 43)$$

The quantities needed to compute the response of the network are obtained from the two-by-two transfer matrix of the LC two-port $$Z(s) = B^T(G+s^2C)^{-1}B, \quad (Eq. 44)$$

where B denotes the two-column matrix [a l]. Observe that $$Z_{in} = -sh_{11}(s)$$

and $$\alpha = -h_{21}(s). \quad (Eq. 45)$$

SyMPVL is applied to compute the matrix-Padé approximation of this two-by-two transfer function. In this case, the matrix G is singular, or in electrical terms, there is no DC path to the reference voltage (ground) from every node. The transfer function computation requires therefore a frequency shift $$Z(s) = B^T(\underbrace{G+s_0 C}_{\hat{G}} + \underbrace{(s^2-s_0)C}_{\sigma})^{-1}B. \quad (Eq. 46)$$

In view of (Eq. 28), the approximation will have the form $$Z_n(s) = \rho_n^T(I_n+\sigma T_n)^{-1}\rho_n. \quad (Eq. 47)$$

An approximation of order 50 was needed to obtain a good match of the function as illustrated in FIG. 5. Since the change of variables included the square of s, we have, in fact, a matrix-Padé approximation of order n=50, and we match $2\lfloor n/p \rfloor = 2\lfloor 50/2 \rfloor = 50$ matrix moments. Running the procedure six more iterations results in a perfect match. Note that in this example the matrices C and G are real, symmetric and positive definite, and therefore, the approximation always preserves all stability and passivity properties.

B. A Package Model

Figure 6:
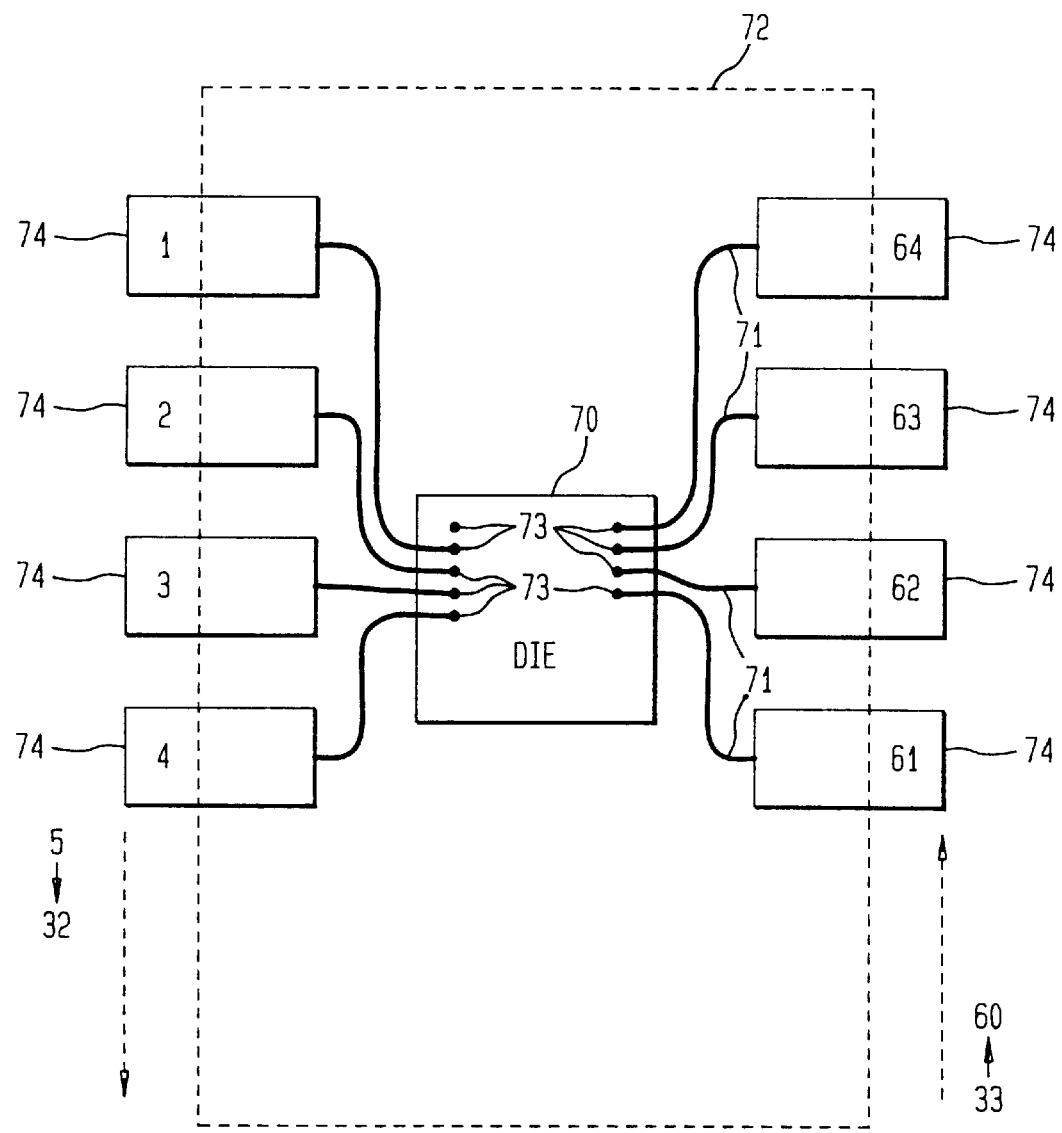
FIG. 6 is a diagram of an exemplary integrated circuit package that can be analyzed using the method and apparatus of the present invention.

As a further example, we analyze a 64-pin package model used for an RF integrated circuit. The integrated circuit is illustrated in FIG. 6 and comprises a die 70, external pins 74 and wirebonds 71 from the die connector pads 73 to the package external pins 74. The package is represented in the figure by dashed line 72. Only eight of the package pins 74, pins 1–4 and 61–64, carry signals, the rest being either unused or necessary for supply voltages. The goal is to characterize the package as a 16-port component (8 exterior and 8 interior terminals) and apply the SyMPVL model reduction on it. The reduced-order model can then replace the large package subcircuit in a circuit simulator resulting in considerable savings in simulation time.

The package model is described by approximately 4000 circuit elements, resistors, capacitors, inductors, and inductive couplings. The size of the nodal circuit matrices for the package is about 2000.

FIG. 7 shows the voltage-to-voltage transfer function between the external terminal 74 of pin no. 1 and the internal terminal 73 of the same pin. FIG. 8 shows the voltage-to-voltage transfer function between the external terminal 74 of pin no. 1 and the internal terminal 73 of the neighboring pin no. 2. The voltage-to-voltage transfer function between external terminal of pin no. 1 and internal terminal of pin no. 2 illustrated in FIG. 8 is a parasitic interference signal. The plots show results with a reduced model of order 48, 64, and 80 compared with an exact analysis. The results show that reduced-order models can indeed replace the full package subcircuit with little loss of accuracy. The reduction level depends on the desired accuracy. The most accurate of the models that gives an almost perfect match of the frequency response requires only 80 state variables compared to 2000 for the full subcircuit. Since the cost of nonlinear circuit simulation is superlinear in the number of state variables, the computational savings can be significant.

As noted above, the application of post-processing techniques to the approximant $Z_n(S)$ can be used to assure stability and passivity.

VI. Conclusions

We have introduced the present method and apparatus as a tool to compute reduced-order models (based on the matrix-Padé approximation) for large passive linear circuit multi-ports. It is more efficient than the more general MPVL and has the property of generating guaranteed stable and passive models for the special cases of RC, RL and LC circuits. The invention is based on a novel symmetric block-Lanczos procedure.

While the reduced-order models generated in accordance with the present invention cannot be guaranteed to be stable and passive for general RLC circuits, they can be made stable and passive using the suitable "post-processing" techniques.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

We claim:

1. An apparatus comprising:
   a processing unit having:
      a first program for generating a symmetric matrix transfer function relating to a matrix transfer function associated with circuit characteristic data representing a circuit;
      a second program for generating a frequency response signal as a function of the matrix transfer function data; and
      a processor for executing the programs; and
   an output device for displaying said circuit frequency response signal.

2. An apparatus as set forth in claim 1 wherein said symmetric matrix transfer function is guaranteed to be stable and passive when said circuit is an RL, RC or LC circuit.

3. The apparatus of claim 1 wherein the processor, responsive to execution of the first program, calculates characteristic matrix data representing parameters associated with characteristic matrices of the circuit characteristic data, and determines the symmetric matrix Padé approximant from the characteristic matrix data.

4. The apparatus of claim 3 wherein the processor, responsive to execution of the first program, processes the matrix characteristic data to reduce the characteristic matrices and to determine the symmetric matrix Padé approximant therefrom.

5. The apparatus of claim 4 wherein the processor, executing the first program, processes the characteristic matrix data using a symmetric block-Lanczos type procedure.

6. The apparatus of claim 5 wherein the processor, executing the first program, iteratively processes the characteristic data to iteratively reduce the characteristic matrix data using a symmetric block-Lanczos type procedure with look-ahead.

7. The apparatus of claim 1 wherein said processing unit further comprises a second program for generating a frequency response signal using the matrix transfer function data according to a frequency response transfer function, $$Z_n(s) = \rho_n^T(\Delta_n^{-1} + sT_n\Delta_n^{-1})^{-1}\rho_n, \rho_n = \begin{bmatrix} \rho \\ 0_{n-p_1 \times p} \end{bmatrix}$$

where $T_n$ is a banded n by n matrix, s is complex frequency, $\Delta_n$ is a diagonal n by n matrix, and $\rho_n$ is an n by p matrix and are obtained from the circuit characteristic data via a Lanczos type procedure and wherein said processor also executes said second program.

8. An apparatus as set forth in claim 7 wherein said circuit characteristic data is represented by matrices B, C and G and further wherein $$T_n = V_n^T F V_n$$

when said circuit is an RC, RL or LC circuit;
where $V_n$ is a matrix with n columns comprising n Lanczos vectors, and F is a matrix obtained by simultaneously modifying said circuit characteristic data matrices C and G such that G becomes a diagonal matrix.

9. An apparatus as set forth in claim 7 wherein $$Re(y^H(I_n+\bar{s}T_n)y) = \|y\|_2^2 + (Re\ s)y^H T_n y \geq 0$$

for all $y \in \mathbb{C}^n$,
when said circuit is an RC, RL or LC circuit,
where
y represents any complex vector,
$I_n$ is an n by n identity matrix, and
$\mathbb{C}_N$ is a set of complex vectors of length n.

10. An apparatus as set forth in claim 7 wherein the frequency response transfer function is $$Z_n(s) = \rho_n^T(I_n+sT_n)^{-1}\rho_n$$

for RC, RL and LC circuits, where
$I_n$ is an n by n identity matrix.

11. An apparatus for generating a frequency response signal indicative of a frequency response of a circuit, the apparatus comprising:
   a data source providing circuit characteristic data representing the circuit; and
   a processing unit having:
      a memory for receiving and storing the circuit characteristic data from the data source;
      a set of at least one program including a symmetric Matrix Padé via Lanczos type (SyMPVL) program for generating a symmetric matrix Padé approximant of a transfer function relating to the circuit characteristic data;
      a processor for executing the SyMPVL program; and
      means for generating the frequency response signal in response to the symmetric matrix Padé approximant.

12. The apparatus of claim 11 wherein the processor, executing the SyMPVL program, calculates characteristic matrix data representing parameters associated with characteristic matrices of the circuit characteristic data, and determines the symmetric matrix Padé approximant from the characteristic matrix data by a block-Lanczos type procedure.

13. The apparatus of claim 12 wherein the processor, executing the SyMPVL program, processes the matrix characteristic data to reduce the characteristic matrices using a plurality of Lanczos vectors and to determine the symmetric matrix Padé approximant therefrom.

14. The apparatus of claim 13 wherein the processor, executing the SyMPVL program, processes the characteristic matrix data using the symmetric block-Lanczos type procedure on the plurality of Lanczos vectors.

15. The apparatus of claim 14 wherein the processor, executing the SyMPVL program, iteratively processes the characteristic matrix data and the plurality of Lanczos vectors to iteratively reduce the characteristic matrix data using a symmetric block-Lanczos type procedure with look-ahead.

16. An apparatus as set forth in claim 15 wherein said circuit characteristic data is represented by matrices B, C and G and further wherein $$T_n = V_n^T F V_n$$

when said circuit is an RC, RL or LC circuit;

where $V_n$ is a matrix with n columns comprising n Lanczos vectors, and F is a matrix obtained by simultaneously modifying said circuit characteristic data matrices C and G such that G becomes a diagonal matrix.

17. An apparatus as set forth in claim 15 wherein $$Re(y^H(I_n + \bar{s}T_n)y) = \|y\|_2^2 + (Re\ s)y^H T_n y \geq 0$$

for all $y \in \mathbb{C}^n$, when said circuit is an RL, RC or LC circuit, where $T_n$ is a banded n by n matrix;
s is complex frequency;
y represents any complex vector,
$I_n$ is an n by n identity matrix, and
$\mathbb{C}_N$ is a set of complex vectors of length n.

18. An apparatus as set forth in claim 15 wherein the frequency response transfer function is $$Z_n(s) = \rho_n^T (I_n + sT_n)^{-1} \rho_n$$

for RL, RC and LC circuits, where
$T_n$ is a banded n by n matrix;
s is complex frequency;
$\rho_n$ is an n by p matrix; and
$I_n$ is an n by n identity matrix.

19. A circuit analyzer for generating a graphic representation of a predicted performance of a circuit, the circuit analyzer comprising:

an input device for inputting a plurality of circuit parameters representing the circuit;
memory for receiving and storing the circuit parameters;
a processor for executing stored programs and including:
 means for generating matrix characteristic data representing a transfer function of the circuit;
 means for performing a block-Lanczos type procedure on the matrix characteristic data;
 means for calculating a symmetric matrix Padé approximant of the transfer function of the circuit;
 means for generating the graphic representation from the symmetric matrix Padé approximant to predict the performance of the circuit; and
a display for displaying the graphic representation.

20. The circuit analyzer of claim 19 wherein the block-Lanczos type procedure performing means performs the block-Lanczos type procedure with look-ahead using the matrix characteristic data.

21. The circuit analyzer of claim 20 wherein the block-Lanczos type procedure performing means iteratively generates a plurality of intermediate parameters from the processed circuit parameters and stores the generated intermediate parameters in the memory.

22. The circuit analyzer of claim 21 wherein the intermediate parameters of an $n^{th}$ iteration are used by the block-Lanczos type procedure performing means to generate an $(n+1)^{TH}$ iteration of intermediate parameters.

23. The circuit analyzer of claim 22 wherein the block-Lanczos type procedure performing means generates matrix data representing a banded n by n matrix, $T_n$, a diagonal n by n matrix, $\Delta_n$, and an n by p matrix, $\varrho_n$, from the stored intermediate parameters, where n is an integer corresponding to a number of iterations and p is an integer corresponding to a number of electrical connection points of said circuit externally of said circuit.

24. A method for generating a frequency response signal of a circuit, the method comprising the steps of:

providing circuit characteristic data associated with the circuit;
generating characteristic matrix data associated with the circuit characteristic data representing parameters associated with characteristic matrices of the circuit characteristic data;
generating a symmetric matrix transfer function data relating to a matrix transfer function associated with the characteristic matrix data; and
generating the frequency response signal in response to the matrix transfer function data.

25. The method of claim 24 wherein the step of generating the frequency response signal includes the step of determining a frequency response transfer function $$Z_n(s) = \rho_n^T (\Delta_n^{-1} + sT_n \Delta_n^{-1})^{-1} \rho_n, \rho_n = \begin{bmatrix} \rho \\ 0_{n-p_1 \times p} \end{bmatrix}$$

where $T_n$ is a banded n by n matrix, s is complex frequency, $\Delta_n$ is a diagonal n by n matrix, $\rho_n$ is an n by p matrix and are obtained from the circuit characteristic data via a Lanczos type procedure.

26. A method for analyzing a circuit to predict performance of a circuit, comprising the steps of:

receiving from an input device a plurality of circuit parameters representing the circuit;
processing the circuit parameters to generate characteristic matrix data representing parameters associated with characteristic matrices;
performing a block-Lanczos type procedure on the processed parameters to generate a plurality of Lanczos vectors;
calculating a symmetric matrix Padé approximant of a transfer function of the circuit from the plurality of Lanczos vectors;
generating a graphic representation from the symmetric matrix Padé approximant to predict the performance of the circuit; and
displaying the graphic representation on a display.

27. The method of claim 26 wherein the step of performing the block-Lanczos type procedure includes performing look-ahead using matrix characteristic data.

28. An apparatus as set forth in claim 27 wherein the frequency response transfer function is $$Z_n(s) = \rho_n^T (I_n + sT_n)^{-1} \rho_n$$

for RL, RC and LC circuits, where
$T_n$ is a banded n by n matrix;
s is complex frequency;
$\rho_n$ is an n by p matrix; and
$I_n$ is an n by n identity matrix.

29. The method of claim 26 wherein the step of performing the block-Lanczos type procedure includes the steps of:
   iteratively generating a plurality of intermediate parameters from the processed parameters; and
   storing the generated intermediate parameters in a memory.

30. The method of claim 29 wherein the step of performing the block-Lanczos type procedure includes the step of generating matrix data representing a matrix transfer function from the stored intermediate parameters.

31. An apparatus as set forth in claim 30 wherein $$\text{Re}(y^H (I_n + \bar{s}T_n)y) = \| y \|_2^2 + (\text{Re } s) y^H T_n y \geq 0 \text{ for all } y \in \mathbb{C}^n.$$

when said circuit is an RL, RC or LC circuit,
where
$T_n$ is a banded n by n matrix;
s is complex frequency;
y represents any complex vector,
$I_n$ is an n by n identity matrix, and
$\mathbb{C}_N$ is a set of complex vectors of length n.

32. An apparatus as set forth in claim 30 wherein said circuit characteristic data is represented by matrices B, C and G and further wherein $$T_n = V_n^T F V_n$$

when said circuit is an RC, RL or LC circuit;

where $V_n$ is a matrix with n columns comprising n Lanczos vectors, and F is a matrix obtained by simultaneously modifying said circuit characteristic data matrices C and G such that G becomes a diagonal matrix.

33. An apparatus comprising:
   a processing unit having:
      a memory for storing circuit characteristic data representing a circuit;
      a first program for generating a symmetric matrix transfer function relating to a matrix transfer function associated with circuit characteristic data representing a circuit;
      a second program for generating a frequency response signal as a function of the matrix transfer function data; and
      a processor for executing the programs.

34. An apparatus comprising:
   a processing unit having:
      a memory for storing circuit characteristic data representing a circuit;
      a program for generating a symmetric matrix transfer function relating to a matrix transfer function associated with circuit characteristic data representing a circuit;
      a processor for executing the programs; and
      means for generating a frequency response signal in response to the matrix transfer function data.

* * * * *